United States Patent [19]

Van Schoiack

[11] 4,078,205
[45] Mar. 7, 1978

[54] ELECTRONIC FILTER CIRCUIT

[75] Inventor: Michael Marion Van Schoiack, Bellevue, Wash.

[73] Assignee: Sundstrand Data Control, Inc., Redmond, Wash.

[21] Appl. No.: 624,806

[22] Filed: Nov. 3, 1975

[51] Int. Cl.$^2$ ............................................. H03F 1/34
[52] U.S. Cl. .................................... 330/107; 330/109
[58] Field of Search ............... 330/107, 109; 328/167; 333/80 R, 80 T

[56] References Cited

U.S. PATENT DOCUMENTS

| 3,564,441 | 2/1971 | Eide | 330/109 X |
|---|---|---|---|
| 3,702,405 | 11/1972 | Zwirn et al. | 330/80 T X |
| 3,886,469 | 5/1975 | Rollett et al. | 330/107 |
| 3,895,309 | 7/1975 | Rollett et al. | 330/107 |

FOREIGN PATENT DOCUMENTS 887,823   12/1971   Canada ............................... 330/107

Primary Examiner—James B. Mullins
Attorney, Agent, or Firm—Michael B. McMurry; Ted E. Killingsworth; William R. Peoples

[57] ABSTRACT

To eliminate the high frequency portion of an input signal while permitting low frequency and DC portions to pass, the electronic filter utilizes an n-1 order active network in combination with a capacitor to generate a shunt current, thereby providing a low pass filter having n-order operating characteristics. Included in the active network is an active element, such as an operational amplifier, which responds to an input signal by creating a voltage across the capacitor, resulting in a shunt current that in turn provides the desired filter characteristics. In certain special cases the n-order active filter can utilize a differentiating element in combination with n-2 order active network along with the capacitor to achieve n-order operating characteristics.

23 Claims, 10 Drawing Figures

ELECTRONIC FILTER CIRCUIT

BACKGROUND OF THE INVENTION

The invention relates to the field of electronic signal filters and more particularly to the field of active shunt, low pass filters.

There are many applications where it is considered highly desirable to permit low frequency signals including a DC current to flow through the filter and at the same time to provide for rapid attenuation of the signal above a predetermined, or break frequency. For example, in accelerometers it is desirable to pass, with as little attenuation as possible, the DC or low frequency output of the accelerometer while at the same time filtering out higher frequency signals that may be generated by vibration or the like.

In addition to having demanding frequency response characteristics, the use of filters with accelerometers requires that the physical dimensions of the filter be as small as possible since they are quite often used in applications where weight and space are critical such as missile guidance systems. Therefore, in addition to providing the desired operational characteristics, it is considered highly desirable to reduce the actual physical size and weight of the filter components to a minimum. These size and weight considerations tend to rule out purely passive filters due to the fact that they require one or more inductors which, of course, add weight and size along with generally increased cost. Besides being smaller and lighter, active elements generally provide more in the way of design flexibility and better frequency response than filters constructed out of only passive elements, since an active RC network can result in a filter with natural frequencies anywhere in the left half of the complex frequency plane. It is also considered desirable to reduce the number of stages required for a particular order of operation. In many of the prior art active filters, such as Morris U.S. Pat. No. 3,122,714, it is necessary to cascade a number of filter stages to get a higher order of operation.

SUMMARY OF THE INVENTION

It is therefore an object of the invention to provide a single stage, $n$-order, active shunt filter that utilizes an $n$-1 order active network in combination with a capacitor to generate a shunt current in response to an input signal.

It is a further object of the invention to provide an $n$-order, active shunt filter that utilizes an $n$-1 order active network connected to the output of the filter by means of a capacitor wherein the transfer function of the active network is adjusted to minimize the size of the capacitor.

It is an additional object of the invention to provide a low pass filter of any $n$-order without the necessity for cascading separate filter stages.

It is still a further object of the invention to provide an $n$-order, active shunt filter that utilizes an $n$-2 order active network in combination with a capacitive element and a differentiating element to generate a shunt current in response to an input signal.

The filter responds to an input signal, either from a voltage source or current source, applied to a pair of input terminals. Connected across the input terminals is an active network containing an acitve element such as an operational amplifer. The input impedance to the active network is maintained at very high levels so that the current actually flowing into the active network, and thus, its effect on the output of the filter, is minimized. A capacitor is used to connect the output of the active network to the output of the filter. The active network responds to the input signal in such a manner as to generate across the capacitor a voltage which results in a shunt current flowing from the output of the filter through the active network, thereby providing the desired filter characteristics. By adjusting the value of the transfer function of the active network, the voltage across the capacitor, and hence the size of the capacitor, can be adjusted in order to provide the desired shunt current.

As a result, it is possible to produce a filter having a single stage which will have essentially any order response desired and since an $n$-1 active network is utilized, the number of components in the active network is reduced. In addition, by increasing the voltage output of the active network, the size of the capacitor required to produce the same shunt current is reduced, thus making it possible to further reduce the physical dimensions of the filter.

Under certain circumstances the selection of the capacitor along with other filter elements having certain predetermined relationships to the active network's transfer function makes it possible to achieve $n$-order filter characteristics by utilizing an $n$-2 order active network in combination with a differentiating element. This approach significantly reduces the synthesis problems in designing practical filters.

This approach to low pass filter design provides two major advantages: first, the active portion of the filter is designed with at least one less order of operation, $n$-1, with the concomitant reduction in the active network components; and secondly, the physical size of the capacitor may be reduced by increasing the voltage output of the active network, thus reducing the physical dimensions of the filter.

DETAILED DESCRIPTION OF THE INVENTION

Figure 1:
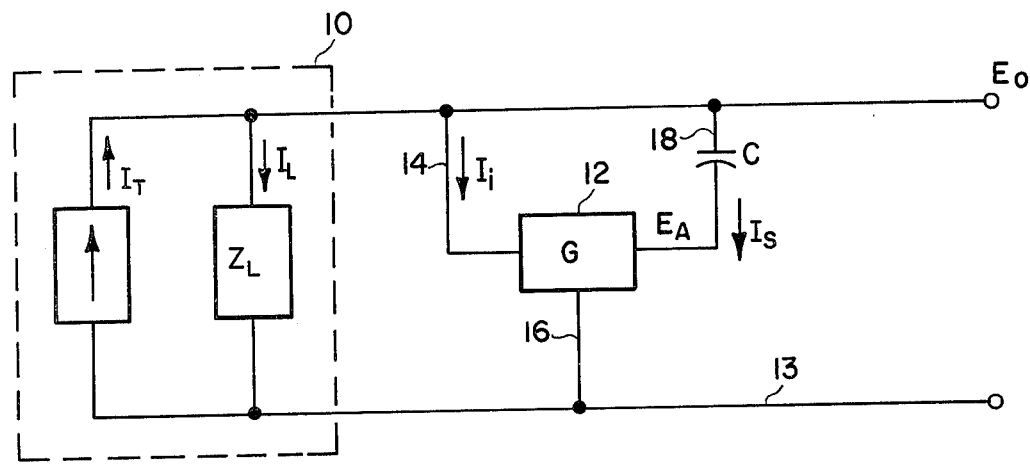
FIG. 1 is a block diagram of an $n$-order active shunt low pass filter.

In the block diagram of FIG. 1 an $n$-order, low pass filter is illustrated in conjunction with a current source utilized for signal input. The input signal source, in this case a current source, is indicated within the dashed line 10, and, for example, could represent the signal output of an accelerometer. In the signal source 10, a portion of the current $I_T$ is shunted through a load impedance $Z_L$. An active network 12, having a transfer function G, receives its input from the current source 10 by means of a line 14 and in order to maintain the actual current flow through line 14 as small as possible, the input impedance of the active network 12 is very high. The active network 12 is also connected to the lower portion of the filter, represented by a line 13, by means of a line 16. Normally, the lower portion 13 of the filter will be maintained at a reference or ground potential. Output of the active network 12 is connected to the output of the filter by means of a capacitor C inserted in line 18. The basic filter operation is thus provided by a shunt current $I_S$ flowing through line 18 and line 16 wherein the actual magnitude of $I_S$ is a function of the size of the capacitor C and the voltage $E_A$ produced by the active network 12. The relationship between the output voltage of the filter $E_o$ and $E_A$ is governed by the transfer function G of the active network 12, where $G = E_A/E_o$. Thus, the desired filter is obtained by utilizing an active network 12 having a transfer function G that generates the voltage $E_A$, which in combination with capacitor C, results in a shunt current $I_S$, thereby providing a filter having an $n$-order response.

Transfer function G of active network 12 resulting in an $n$-order filter having the desired characteristics is represented by the equation:

$$\frac{E_A}{E_o} = -\frac{1}{CS}\left[\frac{D}{R_L} - \frac{1}{Z_L} - CS\right] \quad (1)$$

where: S represents the Laplace operator; $R_L$ represents the real portion of the impedance $Z_L$ at DC; and D represents the Laplace portion of the filter output, i.e. $D = A_n S^n + A_{n-1} S^{n-1} + \ldots + AS + 1$, where $A_n, A_{n-1}, \ldots A$ represent the filter polynomial coefficients.

The transfer function G represented by equation (1) results from the following relationships inherent in the circuit of FIG. 1. For example, the output signal $E_o$ of the filter is represented by the equation:

$$E_o = \frac{I_T R_L}{A_n S^n + A_{n-1} S^{n-1} + \ldots + AS + 1} = \frac{I_T R_L}{D} \quad (2)$$

where $I_T R_L$ serves to define the DC characteristics of the filter output signal $E_o$ and D defines the AC characteristics of the output signal $E_o$. Since $E_o$ is also equal to $I_L Z_L$ or $(I_T - I_S) Z_L$, the shunt current $I_S$ can be represented as:

$$I_S = [(Z_L D - R_L)/Z_L D] I_T \quad (3)$$

by combining $E_o = (I_T - I_S) Z_L$ with equation (2). Here the shunt current $I_S$ across the capacitor C of FIG. 1 can also be represented as:

$$I_S = (E_o - E_a) CS \quad (4)$$

and by substituting equation (4) into equation (3) as such:

$$I_S = \left[\frac{Z_L D - R_L}{Z_L D}\right] \left[\frac{E_o D}{R_L}\right] = (E_o - E_A) CS \quad (5)$$

$$E_o \left[\frac{D}{R_L} - \frac{1}{Z_L} - CS\right] = -E_a CS \quad (6)$$

the basic transfer equation (1) of the active network 12 in FIG. 1 results, i.e.

$$G = \frac{E_A}{E_o} = -\frac{1}{CS}\left[\frac{D}{R_L} - \frac{1}{Z_L} - CS\right] \quad (1)$$

It should be understood that the active network transfer equation G depends in any practical filter on the nature of the impedance $Z_L$. Taking, for example, as a first special case, a filter where $Z_L$ is equal to the simple resistance $R_L$, the transfer equation G of equation (1) is equal to:

$$G = \frac{E_A}{E_o} = -\frac{1}{R_L CS}[D - 1 - R_L CS] \quad (7)$$

since $R_L$ is merely substituted for $Z_L$ in equation (1). In this case, by replacing D with the filter polynomial, the transfer function equation (7) becomes:

$$G = -\left[\frac{A - R_L C}{R_L C}\right] \cdot \left[\frac{A_n}{A - R_L C} S^{n-1} + \frac{A_{n-1}}{A - R_L C} S^{n-2} + \frac{A}{A - R_L C} S + 1\right] \quad (8)$$

Inspection of the transfer function equation (8) G reveals that it is only necessary to synthesize an $n$-1 order network to produce an $n$-order filter. Along with reducing the number of components in the active network, the requirement of only synthesizing an $n$-1 order network substantially reduces the amount of circuit analysis and synthesis involved in designing an $n$-order filter. Another very significant advantage results from the fact that the output voltage $E_A$ of the active network 12 is a function of the capacitor C. It is clear from the transfer function G in equation (8) that by increasing the voltage $E_A$ the size of the capacitor C may be reduced while maintaining the same shunt current $I_S$ and hence the same filter characteristics. Thus, by designing the active network 12 to produce a maximum output voltage $E_A$ the capacitance and thus the size of the capacitor C can be reduced to a minimum.

Once the transfer function G has been so defined and the operating parameters of a desired filter, such as the break frequency and damping ratios, are set forth, it is a straightforward process, using conventional network synthesis techniques, to develop an electronic circuit for implementing the filter. This process will be illustrated for both a first and a second order filter having the transfer equation (8).

Assuming, first, that a first order ($n=1$) filter is desired with a break frequency, $f_o = 100$ Hz, the transfer function G of equation (8) becomes:

$$G = \frac{E_A}{E_o} = \left[\frac{A - R_L C}{R_L C}\right] \cdot 1 \quad (9)$$

where the filter polynomial coefficient $A$ is equal to $1/(2\pi f_o)$ or $1.59\ (10^{-3})$ seconds. Further, specifying a value of 200 ohms for the load resistor $R_L$ and maximum values for the active network voltage $E_A$ of 15 volts and of the filter output voltage $E_o$ of 2 volts, the transfer function becomes:

$$\frac{E_A}{E_o} = \frac{15}{2} = \frac{1.59\ (10^{-3}) - 200\ C}{200\ C} \quad (10)$$

which results in a value of $C$ of $0.94\mu f$.

Figure 2:
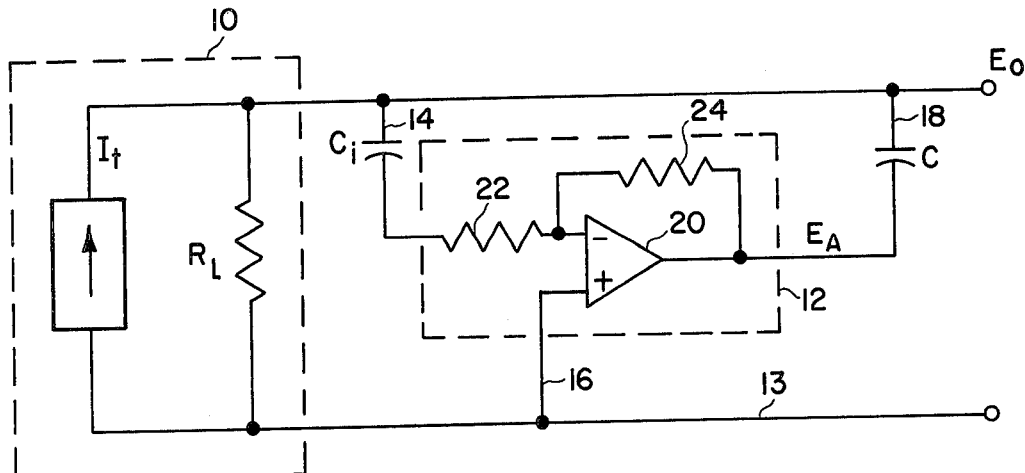
FIG. 2 is a schematic diagram of a first order shunt filter wherein the load impedance of $Z_L$ of FIG. 1 is equal to a simple resistance $R_L$.

The techniques of actually synthesizing a circuit from a transfer function are well-known in the art and are set forth in many standard texts such as *Introduction to Modern Network Synthesis* by M. E. Van Valkenburg, and *Network Synthesis*, by D. F. Tuttle. There are a large number of circuits that can be used to satisfy the requirements for a particular filter and it is often most convenient to select one from a circuit handbook such as the *Operational Amplifiers Design and Application* published by the McGraw Hill. Such a circuit utilizing operational amplifiers for implementing first order operation is illustrated in FIG. 2. In the circuit of FIG. 2 the first order filter includes an operational amplifier 20 having its positive terminal connected to ground by means of line 16. Since G in this case is equal to 7.5, the amplifier 20 is connected in an inverting mode with a closed loop gain of 7.5. The dashed lines 12 in FIG. 2 correspond to the active network 12 of FIG. 1 and $R_L$ and G correspond to $Z_L$ and C of FIG. 1 along with lines 13, 14, 16, and 18. As computed above, C has a value of $0.94\mu f$ and the load resistor $R_L$ is equal to 200 ohms. The resistor 22 has a value of 100 K ohms and the feedback resistor 24 has a value of 750 K ohms. The first order filter of FIG. 2 also includes capacitor $C_i$ in order to achieve complete capacitive coupling of the active network 12. It is preferred that the value of $C_i$ be selected to maintain the input impedance to the active network at a very high level.

Figure 3:
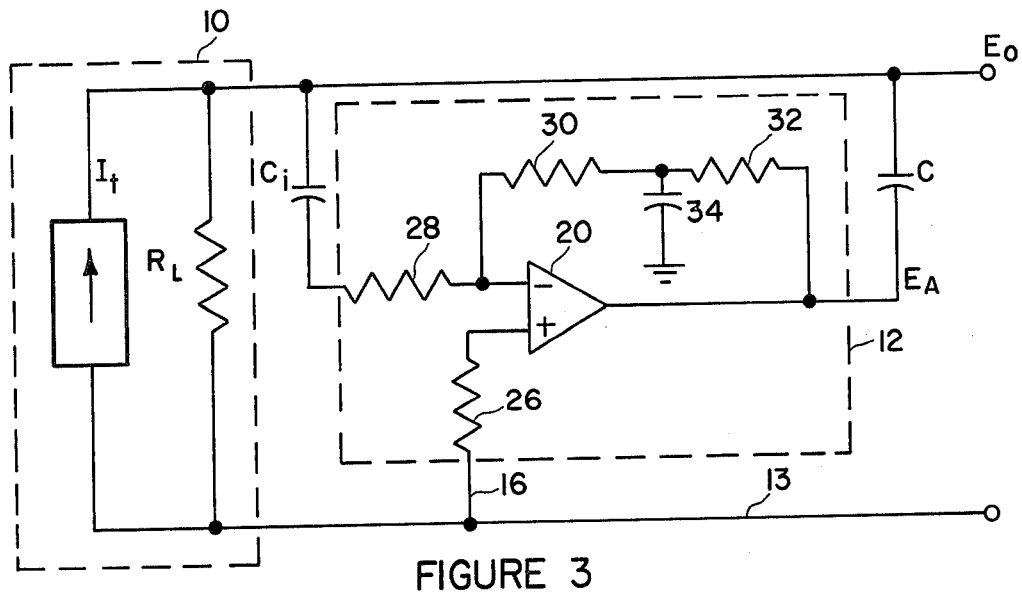
FIG. 3 is a schematic diagram of a second order shunt filter wherein the load impedance $Z_L$ of FIG. 1 is equal to a simple resistance $R_L$.

A second order filter is illustrated in FIG. 3 with the elements corresponding to the elements in FIG. 1 having the same reference numerals. For purposes of this example, the load resistance $R_L$ is 350 ohms and the desired filter characteristic includes a $fn = \omega n/2\pi = 30$ Hz and a damping ratio of 0.55. The transfer function $G$ of equation (8) becomes for a second order filter:

$$G = \left[\frac{A - R_L C}{R_L C}\right] \cdot \left[\frac{A_2}{A - R_L C} S + 1\right] \quad (11)$$

where the filter polynomial coefficients $A_2 = 1/(\omega n^2) = 2.81\ (10^{-5})$ and $A = 2\delta/\omega n = 5.84\ (10^{-3})$. Combining equations (8) and (2) to get an expression that defines the value of $E_A$ for a second order filter results in:

$$E_A G E_o = \quad (12)$$

$$I_T R_L \left[\frac{A - R_L C}{R_L C}\right] \frac{\left[\frac{A_2}{A - R_L C} S + 1\right]}{A_2 S^2 + AS + 1}$$

Assuming a peak value of 8.5 ma for $I_T$, the value of $E_A$ will peak whenever the term $M$, as defined below, is at its maximum value. $M$ is the Laplace portion of equation (12).

$$M = \left[\frac{\left(\frac{A_2}{A - R_L C}\right)S + 1}{A_2 S^2 + AS + 1}\right] S = j\omega \quad (13)$$

By considering $C$ to be very small and ignoring it, the term $M$ can be evaluated over the frequency range of interest resulting in a maximum value of 1.3 at 25 Hz. Then the value of $C$ is approximated by solving the equations below for $C$:

$$E_A(\max) = -I_T(\text{peak}) \cdot R_L \cdot \left(\frac{A - R_L C}{R_L C}\right) \cdot M \quad (14)$$

$$C = \frac{I_T(\text{peak}) \cdot M \cdot A}{E_A(\max) + I_T(\text{peak}) \cdot R_L \cdot M} \quad (15)$$

giving $C = 4.06\mu f$.

This value of C is substituted back into equation (13) above to get a second maximum value of M which turns out to be 1.46 at 25 Hz. Utilizing this value for M in equation (14) results in a peak voltage for $E_A$ of 13.5 which is considered to be too high for this particular application. Therefore, the process is repeated by using the value of 1.46 for M to compute a new value of C in equation (15) resulting in a capacitance of $4.43\mu f$. Again using the new value of C, equation 14 is solved for the peak $E_A$ resulting in a peak voltage of 12.2 volts.

The iterative process described above can be used to compute a value for C to the desired accuracy. A circuit employing these values in a second order filter is provided in FIG. 3. The load resistor $R_L$ has a value of 350 ohms and the capacitor C has a value of $4.43\mu f$ as computed above. Included is the operational amplifier 20 with its positive terminal connected through a 333 K ohm resistor 26 to the lower portion of the filter represented by line 13. The negative terminal of amplifier 20 is connected through resistor 28, having a resistance of 499 K ohms, to the input line 14. Also shown in this embodiment is a capacitor $C_i$ which can be used to capacitively couple the active network, enclosed by dashed lines 12, to the input signal. The active network 12 additionally includes a feedback network for the amplifier 20 which includes resistors 30 and 32, each having a value of 499 K ohms, and the capacitor 34 having a capacitance of $0.016\mu f$.

Returning to the generalized concept of the $n$-order filter illustrated in FIG. 1, the selection of a load impedance $Z_L$ of other than a pure resistance, as discussed above, will affect the transfer equation (1) of the active network 12. As an example of a second special case, the load impedance $Z_L$ illustrated in FIG. 4 consists of a load capacitor $C_L$ in parallel with the load resistor $R_L$. Here $Z_L$ wil be equal to:

$$Z_L = R_L/(R_L C_L S + 1) \quad (16)$$

which results in transfer equation (1) becoming:

$$G = \frac{E_A}{E_o} = \quad (17)$$

-continued $$-\frac{1}{CS}\left[\frac{D}{R_L} - \frac{R_L C_L S}{R_L} - \frac{1}{R_L} - \frac{R_L CS}{R_L}\right]$$

$$G = \frac{1}{R_L CS}[D - 1 - R_L(C + C_L)S] \tag{18}$$

Then by substituting in the filter polynomial for D, the transfer equation becomes:

$$G = \frac{A - R_L(C + C_L)}{R_L C}\left[\frac{A_n S^{n-1}}{A - R_L(C + C_L)} + \frac{A_{n-1} S^{n-2}}{A - R_L(C + C_L)} + \cdots + \frac{A_2 S}{A - R_L(C + C_L)} + 1\right] \tag{19}$$

Figure 4:
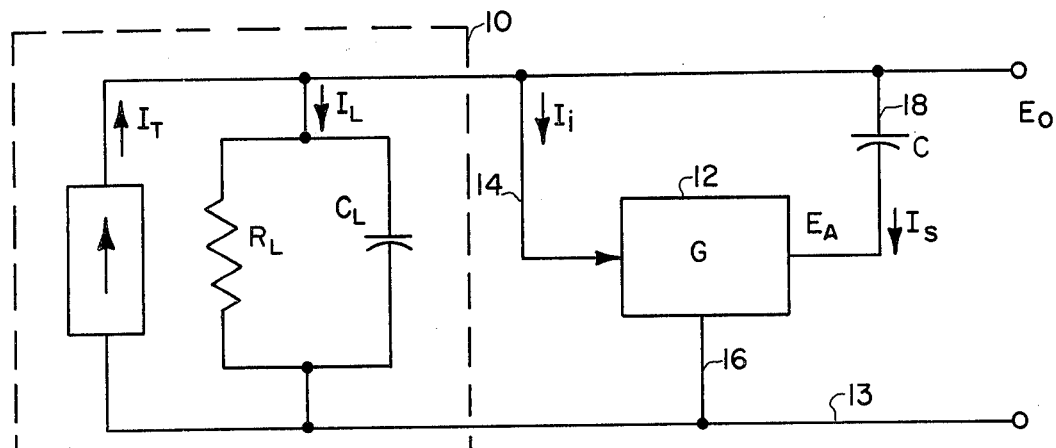
FIG. 4 is a block diagram of the $n$-order active shunt filter of FIG. 1 wherein the load impedance $Z_L$ is a resistor $R_L$ and a capacitor $C_L$ connected in parallel.

As a specific example of this second type of filter represented in FIG. 4, assume a second order filter ($n = 2$) is desired where $R_L = 1000$ ohms and $C_L = C = 1\mu f$. Here, the general filter characteristics will be represented by equation (2) having the value:

$$E_o = \frac{I_T(1000\Omega)}{\frac{S^2}{\omega_n^2} + \frac{2\delta S}{\omega_n} + 1} \tag{20}$$

where the break frequency $\omega_n = 2\pi(10 \text{ Hz})$ and the damping constant $\delta = 0.7$. In this case D becomes:

$$D = \frac{S^2}{[2\pi(10)]^2} + \frac{2(0.7)S}{2\pi 10} + 1 \tag{21}$$

where the filter polynomial coefficients $A_2 = 2.53$ $(10^{-4})$ and $A_1 = 0.022$. Substituting these numeric values into the transfer function equation (19), G becomes:

$$G = \frac{.022 - 1000 \, [2(10^{-6})]}{1000 \cdot 1(10^{-6})}\left[\frac{2.53 \, (10^{-4})S}{.0203} + 1\right] \tag{22}$$

$$G = 20.28 \, [.0125S + 1] \tag{23}$$

Figure 5:
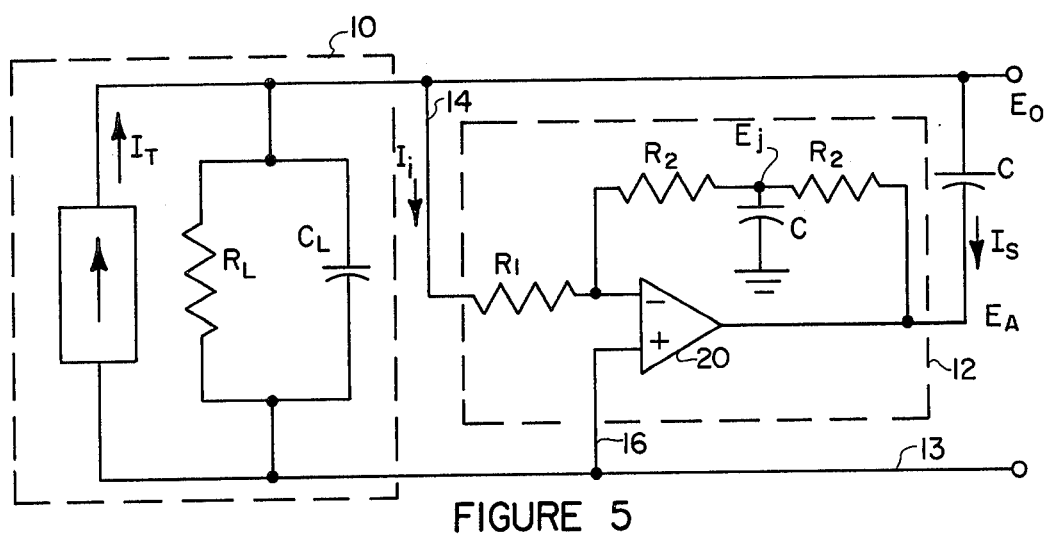
FIG. 5 is a schematic diagram of a second order shunt filter of the type in FIG. 4.

Thus, it is apparent that an active network having a first order response is required. Such a circuit is illustrated in FIG. 5. Values for the various components of the active network are derived from the following relationships. The current $I_i$ in line 14 is equal to:

$$I_i = \frac{E_o}{R_1} = \frac{E_j}{R_2} = E_j C_2 S + \frac{E_j - E_A}{R_2} \tag{24}$$

By eliminating $E_j$ and solving for $E_A/E_o$ the transfer equation G becomes:

$$G = \frac{2R_2}{R_1}\left[\frac{R_2 C_2}{2} S + 1\right] \tag{25}$$

Then by substituting the numeric values in equation (23) for the coefficients in equation (25) values for the circuit elements can be assigned. Thus, by letting $R_1 = 100$ K$\Psi$ the value of $R_2$ can be determined, $$\frac{2R_2}{R_1} = 20 \text{ giving } R_2 = 1M\Omega \tag{26}$$

and since $R_2 C_2/2 = 0.0125$, the value of $C_2$ will be $0.0125\mu f$.

Another significant feature of the filter of FIG. 4 arises from the nature of the transfer function equation (19). By setting the portion $A - R_L(C + C_L)$ equal to 0, equation (19) becomes:

$$G = \frac{S}{R_L C}[A_n S^{n-2} + A_{n-1} S^{n-3} + \cdots + A_2] \tag{27}$$

The implication of equation (27) is that when $A - R_L(C + C_L)$ is set to zero it is possible to implement the filter of FIG. 4 by using a differentiating circuit element such as a capacitor, which corresponds to the $S/(R_L C)$ term of equation (27), in combination with an n-2 order active network. One particular advantage to this approach concerns the fact that it makes it significantly easier to synthesize the active network, since it has one less order.

As an example of this characteristic, a second order filter ($n=2$) having the same performance specifications as the previously described filter in FIG. 5 will be disclosed. Again, the filter will have a load resistance of $R_L = 1000\Psi$, a break frequency of $\omega_n = 2\pi(10 \text{ Hz})$, and a damping constant of $\delta = 0.7$. Here, the general filter characteristic equation (2) will be equal to:

$$E_o = \frac{I_T(1000\Omega)}{\frac{S^2}{(2\pi 10)^2} + \frac{2(.7)S}{2\pi 10} + 1} \tag{28}$$

where the filter polynomial coefficients are: $A = 2.53$ $(10^{-4})$ and $A = 0.022$. Since $A - R_L(C + C_L)$ equals zero, the values of C and $C_L$ if selected to be equal will be:

$$A = 1000 \, (C + C_L) = 0.022 \tag{29}$$

$$C + C_L = 22(10^{-6}) \tag{30}$$

$$C = C_L = 11\mu fd \tag{31}$$

The transfer equation (27) thus becomes:

$$G = \frac{1}{(1000)(11)(10^{-6})}[2.53(10^{-4})S] \tag{32}$$

Figure 6:
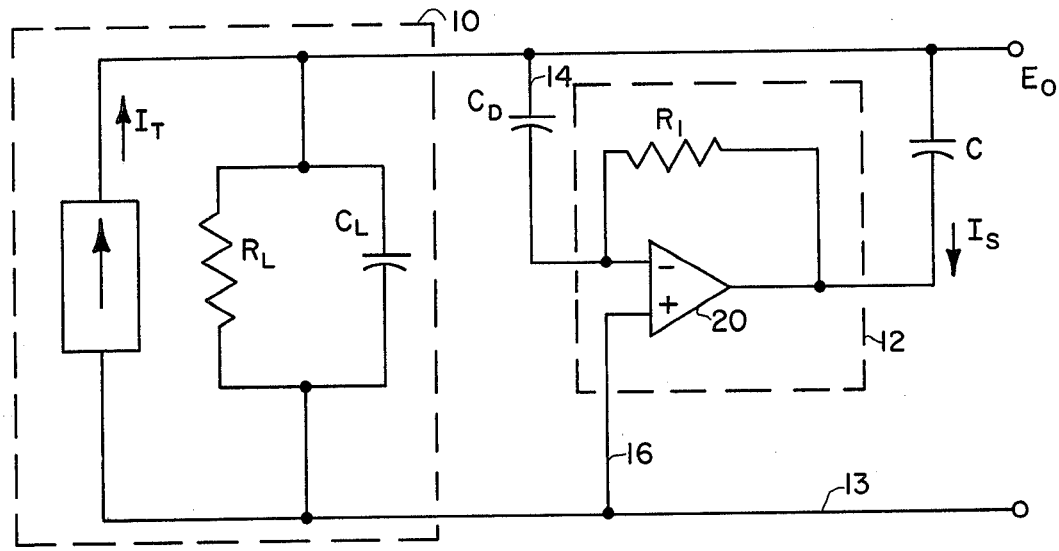
FIG. 6 is a schematic diagram of a second order shunt filter of the type in FIG. 4 wherein a differentiating element is used in combination with an $n$-2 active network.

A circuit which implements the second order filter with an active network having this transfer characteristic is shown in FIG. 6. The differentiating circuit element is represented by a capacitor $C_D$ and the active network is enclosed within the dashed lines 12. The value of the capacitor $C_D$ is selected to be very small in relation to C and $C_L$ so as to minimize the current flow to the operational amplifier 20. Selecting a value of $0.011\mu f$ for $C_D$ the value of the operational amplifier's feedback resistor $R_1$ is determined by: the transfer function G of the combined differentiating element $C_D$ and the active network 12 which is:

$$G = R_1 C_D S = 0.023S \tag{33}$$

Thus, the value of resistor $R_1$ is 2.09 M$\Psi$.

An example of a third order filter based on this concept of using a differentiating element shall also be discussed. In a third order filter the transfer equation (27) becomes:

$$G = (S/R_L C) [A_3 S + A_2] \tag{34}$$

and the filter characteristic equation (2) becomes:

$$E_o = \frac{I_T R_L}{\left(\frac{S}{\omega_1} + 1\right)\left(\frac{S_2}{\omega_{n2}} + \frac{2S}{\omega_n} + 1\right)} \quad (35)$$

Using the same filter characteristics as in the previous examples, equation (35) takes on the value:

$$E_o = \frac{I_T(1000\Omega)}{\frac{S^3}{(2\pi 10)^3} + \frac{2(.7)S^2}{(2\pi 10)^2} + \frac{S}{(2\pi 10)} + 1} \quad (36)$$

$$E_o = \frac{1000 \, I_T}{4.03(10^{-6})S^3 + 6.08(10^{-4})S^2 + .038S + 1} \quad (37)$$

where the filter polynomial coefficients are:
$A_3 = 4.03(10^{-6})$ \quad (38)

$A_2 = 6.08(10^{-4})$ \quad (39)

$A = 0.038$ \quad (40)

Since $A - R_L(C + C_L)$ equals 0, $A = R_L(C + C_L) = 0.038$ \quad (41)

Thus, by setting $C = C_L$ they will each have a value of $19\mu fd$. This will produce transfer equation (34) having the value:

$$G = \frac{S}{1000 \, (10)(19)(10^{-6})} [4.03(10^{-6})S + 6.08(10^{-4})] \quad (42)$$

$$G = .0032S[.0066S + 1] \quad (43)$$

Figure 7:
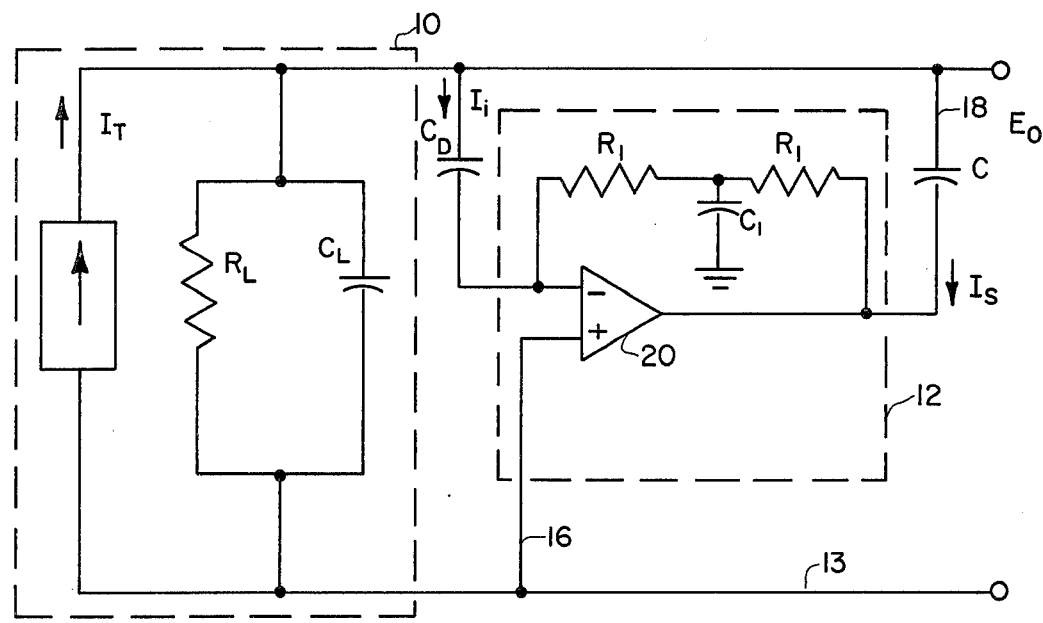
FIG. 7 is a schematic diagram of a third order shunt filter of the type in FIG. 4 wherein a differentiating element is used in combination with an $n$-2 active network.

A circuit for implementing this filter is illustrated in FIG. 7 where a capacitor $C_D$ serves as the differentiating element and the active network including an operational amplifier 20 is enclosed by the dashed lines 12. The transfer function (43) is equal to:

$$G = 2R_1 C_D S[(R_1 C_1/2) S + 1] \quad (44)$$

Thus, by selecting an appropriate capacitance for $C_D$ with the value of $0.1\mu f$, the values of $R_1$ and $C_1$ are determined as follows:

$$R_1 = \frac{.0032}{2C_D} = 16000\Omega \quad (45)$$

$$C_1 = \frac{2[4.03(10^{-6})]}{R_1} = .825 \, \mu fd \quad (46)$$

It is therefore apparent that there are a number of very significant advantages in utilizing an $n$-1 order active network in an $n$-order filter from the standpoint of the significantly reduced requirements for circuit elements and the simplification of the design and synthesis of filters with predetermined performance characteristics. Also, the use of a differentiating circuit element in connection with the active network to reduce the order of the active network provides further advantages in simplifying the design process.

Figure 8:
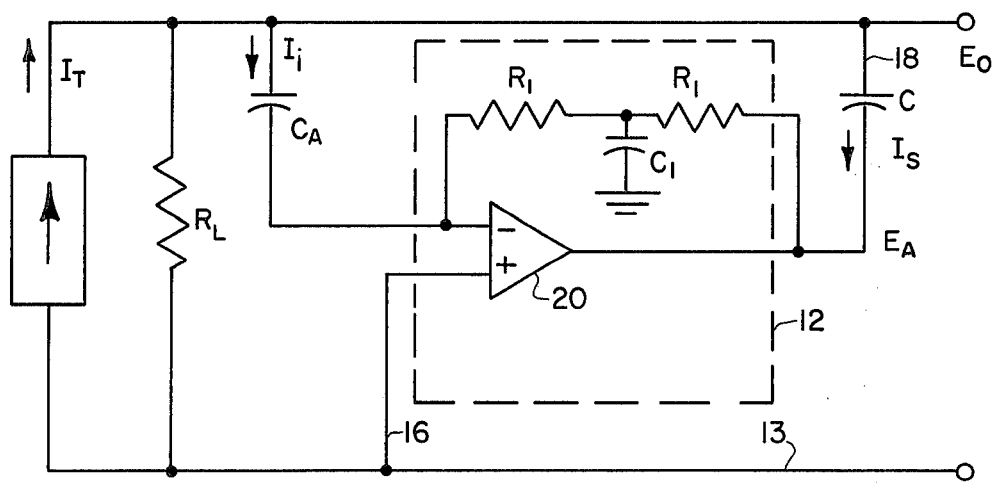
FIG. 8 is a schematic diagram of a third order shunt filter of the type in FIG. 4 wherein a virtual ground concept is used.

Another advantage of the filter concept disclosed herein relates to the characteristics of the operational amplifier 20 which forms the central element in the active network. The fact that both the positive and negative terminals of the operational amplifier 20 are maintained at the same potential allows a virtual ground approach to the filter design. An example of such a filter circuit is provided in FIG. 8. The circuit in FIG. 8 is operationally equivalent to the circuit in FIG. 7, the only difference being that the capacitor $C_A$ of FIG. 8 functionally takes the place of the capacitors $C_L$ and $C_D$ of FIG. 7. This is possible because the negative terminal of the operational amplifier 20 is maintained at the same potential as the positive terminal, thus in effect providing the same electrical characteristics as if capacitor $C_A$ were connected to line 13. Th values for the circuit elements in the filter of FIG. 8 can be computed in essentially the same manner as they were for the filter of FIG. 7. Here, for example, the value of resistors $R_1$ are:

$$2 R_1 C_A = 0.0032 \quad (47)$$

where $C_A$ is equal to $19\mu fd$. Therefore, the resistance of each $R_1$ is equal to $84.2\Psi$. Also, since $$(R_1 C_1)/2 = 0.0066 \quad (48)$$

$C_1$ will have a value of $157\mu fd$. Thus, it is apparent that by using the characteristics of the operational amplifier 20 the number of capacitors can be reduced, thereby further simplifying the filter circuit.

Figure 9:
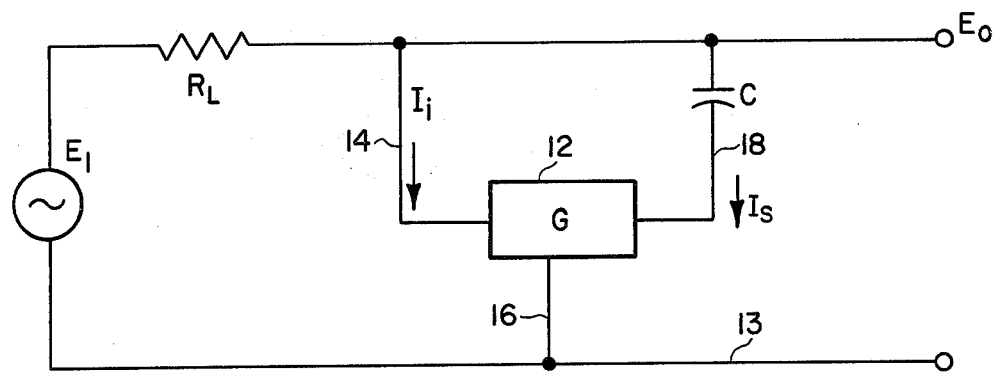
FIG. 9 is a block diagram of the shunt filter of FIG. 1 with a voltage source for input.
Figure 10:
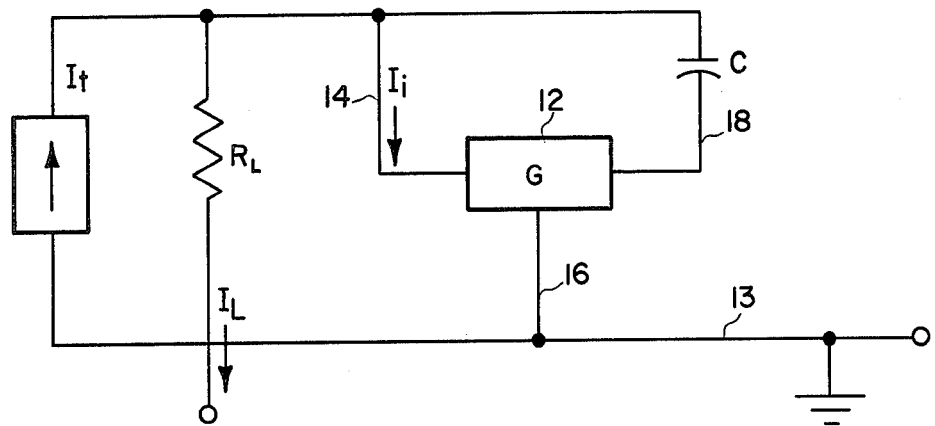
FIG. 10 is a block diagram of the shunt filter of FIG. 1 with a current output.

It should be noted also that the basic concept of the $n$-order filter shown in FIG. 1 is equally applicable to a filter connected to a voltage source $E_1$ with the load resistor $R_L$ in series as illustrated in FIG. 9 or in a filter with a current $I_L$ output as shown in FIG. 10.

We claim:

1. An $n$-order active shunt filter comprising:
   terminal means for receiving an input signal from a signal source;
   an $n$-1 order active network connected across said terminals and responsive to said input signal; and
   capacitor means, operatively connected between said active network means and said terminal means, for generating a shunt current in cooperation with said $n$-1 order active network.

2. An $n$-order active shunt filter comprising:
   a set of input terminals for receiving an input signal from a signal source that includes a load impedence $Z_L$ including a load resistance $R_L$;
   capacitor means, including a capacitor C, operatively connected to one of said terminals for transmitting a shunt current; and
   an $n$-1 order active network, operatively connected to said input terminals and said capacitor means, effective to shunt a current through said capacitor C from the output of the filter, wherein said active network has a transfer function:

$$G = -\frac{1}{CS}\left[\frac{D}{R_L} - \frac{1}{Z_L} - CS\right]$$

wherein $D = A_n S^n + A_{n-1} S^{n-1} + \ldots + AS + 1$, $S$ represents the Laplace operator and $A_n + A_{n-1} + \ldots + A$ represent the filter polynomial coefficients.

3. The active shunt filter of claim 2 wherein said $n$-1 active network is capacitively coupled to said input terminals.

4. The active shunt filter of claim 2 wherein $n = 1$ and said $n-1$ active network includes:

an operational amplifier operatively connected to one of said terminals effective to receive the input signal at its negative input terminal;

a resistor interposed between said operational amplifier's negative input terminal and said input terminal;

a resistive feedback network connecting the output of said operational amplifier with the negative input terminal of said operational amplifier; and means for operatively connecting the output of said operational amplifier to said capacitor C.

5. An $n$-order active shunt filter comprising:

a set of input terminals for receiving an input signal from a signal source that includes a load resistance $R_L$;

capacitor means including a capacitor C operatively connected to one of said terminals for transmitting a shunt current; and an $n$-1 order active network, operatively connected to said input terminals, effective to shunt a current through said capacitor C from the output of the filter, wherein said active network has a transfer function:

$$G = -\left[\frac{A - R_LC}{R_LC}\right]\left[\frac{A_nS^{n-1}}{A - R_LC} + \frac{A_{n-1}S^{n-2}}{A - R_LC} \cdots + \frac{A_2S}{A - R_LC} + 1\right]$$

wherein $S$ represents the Laplace operator and $A_n + A_{n-1} + \ldots + A$ represents the filter polynomial coefficients.

6. The active shunt filter of claim 5 wherein $n=$ and said $n$-1 active network includes:

an operational amplifier having its negative input terminal capacitively coupled to one of said input terminals;

a resistor interposed between said operational amplifier's negative input terminal and said input terminal;

means, including a resistor, for connecting said operational amplifier's positive terminal to the other of said input terminals;

a feedback network, including a grounded capacitor operatively connected between two resistors, connecting the output of said operational amplifier with said negative input terminal; and means for operatively connecting the output of said operational amplifier to said capacitor C.

7. An $n$-order active low pass active shunt filter comprising:

a set of input terminals for receiving an input signal from a signal source including a load resistance $R_L$ and a load capacitance $C_L$ connected in parallel;

an $n$-1 order active network, operatively connected to said input terminals, effective to shunt a current through a capacitor C from the output of the filter, wherein said active network has a transfer function:

$$G = -\frac{1}{R_LC}[A_nS^{n-1} + A_{n-1}S^{n-2} + \ldots + A_2S + A - R_L(C + C_L)]$$

wherein $S$ represents the Laplace operator and $A_n + A_{n-1} + \ldots + A$ represents the filter polynomial coefficients.

8. The active shunt filter of claim 7 wherein $n = 2$ and said $n$-1 active network includes:

an operational amplifier having its negative input terminal coupled to one of said input terminals;

a resistor interposed between said operational amplifier's negative input terminal and said input terminal;

means, for connecting the positive terminal of said operational amplifier to the other of said input terminals;

a feedback network, including a grounded capacitor operatively connected between two resistors, connecting the output of said operational amplifier with said negative input terminal; and means for operatively connecting the output of said operational amplifier to said capacitor C.

9. The $n$-order active filter of claim 7 wherein the values of A, $R_L$, C, and $C_L$ are selected such that the transfer function of said $n$-1 order active network becomes:

$$G = \frac{S}{R_LC}[A_nS^{n-2} + A_{n-1}S^{n-3} + \ldots + A_2].$$

10. The $n$-order active filter of claim 9 wherein said $n$-1 order active network includes:

a differentiating circuit operatively connected to one of said terminals; and an $n$-2 active network operatively connected to said differentiating circuit.

11. The $n$-order active filter of claim 10 wherein said differentiating circuit includes a capacitor $C_D$ operatively connected between one of said input terminals and said $n$-2 active network.

12. The $n$-order active filter of claim 11 wherein $n = 2$ and wherein said $n$-2 active network includes:

an operational amplifier operatively connected to said capacitor $C_D$;

a resistive feedback network connecting the output of said operational amplifier with an input terminal of said operational amplifier; and means for operatively connecting the output of said operational amplifier to said capacitor C.

13. The $n$-order filter of claim 11 wherein $n = 3$ and wherein said active network includes:

an operational amplifier operatively connected to said capacitor $C_D$;

means for connecting said capacitor $C_D$ to one of said input terminals;

a feedback network, including a grounded capacitor operatively connected between two resistors;

means for operatively connecting the output of said operational amplifier to said capacitor C.

14. The $n$-order active filter of claim 11 wherein said $n$-2 order active network includes an operational amplifier having substantially equal potential on each input terminal and combining capacitors $C_D$ and C into a single capacitor $C_A$ operatively connected between one of said input terminals and said operatively amplifier.

15. The $n$-order active filter of claim 14 additionally including:

a feedback network, including a grounded capacitor operatively connected between two resistors, connecting the output of said operational amplifier to said capacitor C.

16. An *n*-order active low pass shunt filter comprising:
a set of input terminals for receiving an input signal from a signal source;
a differentiating circuit operatively connected to one of said input terminals;
an *n*-2 order active network operatively connected between said differentiating circuit and said other input terminal; and
a capacitor C, operatively connected between said *n*-2 active network and said first input terminal.

17. The active filter of claim 16 wherein said signal source includes a load resistor $R_L$.

18. The *n*-order active filter of claim 17 wherein the combined transfer function of said differentiating and said *n*-2 network is:

$$G = -\frac{S}{R_L C} [A_n S^{n-2} + A_{n-1} S^{n-3} + \ldots + A_2]$$

wherein $S$ represents the Laplace operator and $A_n + A_{n-1} + \ldots + A$ represents the filter polynomial coefficients.

19. The *n*-order active filter of claim 18 wherein said differentiating circuit includes a capacitor $C_D$ operatively connected between one of said input terminals and said *n*-2 active network.

20. The *n*-order active filter of claim 19 wherein $n = 2$ and wherein said *n*-2 active network includes:
an operational amplifier operatively connected to said capacitor $C_D$;
a resistive feedback network connecting the output of said operational amplifier with an input terminal of said operational amplifier; and
means for operatively connecting the output of said operational amplifier to said capacitor C.

21. The *n*-order filter of claim 19 wherein $n=3$ and wherein said *n*-2 active network includes:
an operational amplifier operatively connected to said capacitor $C_D$;
means for connecting said capacitor $C_D$ to one of said input terminals;
a feedback network, including a grounded capacitor operatively connected between two resistors;
means for operatively connecting the output of said operational amplifier to said capacitor C.

22. The *n*-order active filter of claim 19 wherein said *n*-2 order active network includes an operational amplifier having substantially equal potential on each input terminal and combining capacitors $C_D$ and C into a single capacitor $C_A$ operatively connected between one of said input terminals and said operational amplifier.

23. The *n*-order active filter of claim 22 additionally including:
a feedback network, including a grounded capacitor operatively connected between two resistors, connecting the output of said operational amplifier with its negative input terminal; and
means for operatively connecting the output of said operational amplifier to said capacitor C.

* * * * *